United States Patent
Su et al.

(10) Patent No.: US 6,833,565 B2
(45) Date of Patent: Dec. 21, 2004

(54) WHITE-LIGHT LED WITH DIELECTRIC OMNI-DIRECTIONAL REFLECTORS

(75) Inventors: Jung-Chieh Su, Hsinchu (TW); Jun-Ren Lo, Taipei (TW); Jim-Yong Chi, Taichung (TW)

(73) Assignee: Industrial Technology Research Institute, Hsinchu Hsien (TW)

( * ) Notice: Subject to any disclaimer, the term of this patent is extended or adjusted under 35 U.S.C. 154(b) by 0 days.

(21) Appl. No.: 10/395,271

(22) Filed: Mar. 25, 2003

(65) Prior Publication Data

US 2004/0119083 A1 Jun. 24, 2004

(30) Foreign Application Priority Data

Dec. 20, 2002 (TW) ........................................ 91136854 A

(51) Int. Cl.[7] .............................................. H01L 33/00
(52) U.S. Cl. ............................ 257/98; 257/99; 257/100
(58) Field of Search ............................ 257/98, 99, 100

(56) References Cited

U.S. PATENT DOCUMENTS 5,813,753 A * 9/1998 Vriens et al. ................ 362/293
6,417,019 B1 * 7/2002 Mueller et al. ................ 438/29

* cited by examiner

*Primary Examiner*—Jerome Jackson
(74) *Attorney, Agent, or Firm*—Brich, Stewart, Kolasch & Birch, LLP

(57) ABSTRACT

A white-light LED with omni-directional reflectors includes an LED chip for emitting white-light. A light transmitting material surrounding the LED and phosphor grains is dispersed in order to excite fluorescence via emission of LED. Two omni-directional reflectors are implemented on the top and/or bottom of the LED symmetrically surrounding the light transmitting material and the LED chip. The light from the LED was reflected omni-directionally, via the dielectric omni-directional reflectors, to increasing the efficiency and/or spectral characteristics and uniformity of the visible light emission.

33 Claims, 4 Drawing Sheets

WHITE-LIGHT LED WITH DIELECTRIC OMNI-DIRECTIONAL REFLECTORS

BACKGROUND OF THE INVENTION

1. Field of Invention

The invention relates to a white-light LED with dielectric omni-directional reflectors used in a light-emitting module that emits white light.

2. Related Art

The light emitted from normal home illuminators such as lamps, U-shape bulbs, flashlights, and illuminators inside vehicles/airplanes/ships is a white light with three wavelengths. The backlit source used in the current TFT-LCD's is also a white light with three wavelengths. It is thus seen that the light-emitting modules for producing white light occupy a great portion of the illumination market.

An omnidirectional dielectric reflector is a multi-layer of transmitting materials in a stacked structure with feature sizes on the order of a wavelength or subwavelength. It is a one-dimensional photonic bandgap crystal that exhibits strong reflection at a certain range of incident light wavelengths (stop bandwidth) irrespective of their directions of propagation and electric field polarizations. In other words, this type of material structure is said to posses a complete photonic bandgap. This leads to the possibility to control the spontaneous emission of an LED. The so-called white light LED is composed of a light-emitting diode (LED) and a phosphor grains layer. The white light can be generated in the phosphor grains layer when light emission from excitation source LED are absorbed and converted into fluorescence. Each color of visible light can be generated from suitable phosphors by using blue, violet and ultraviolet excitation light, then with the combination of converted fluorescence from phosphor grains layer and/or light from LED can generate white light emission. This white light-emission device has few technique difficulties: (1) control of the phosphors white light conversion efficiency. (2) Control of the unpolarized light emission from the uv or blue LED with isotropic angular distribution. (3) Uniformity of fluorescence intensity distribution (4) regulation of the correlated color temperature. Moreover, the so-called "white light" in this specification refers to a mixture of light with several colors. The usual white light observed by human eyes comprises at least two colors of light with different wavelength ranges which are sensitive to human eye. The three color luminous intensity ratio of output fluorescence generally required blue 5–25%, green 20–50% and red 40–80% in order to have a desired color temperature, and the color coordinates are in the range of x=0.22~0.4 and y=0.22~0.4. For example, U.S. Pat. NO. 6,084,250 discloses the control of color rendition by the composition of three phosphors. One may also combine a white light with two different wavelengths can be obtained by mixing blue light and yellow light. Therefore, the enhancement and/or control of conversion efficiency for phosphor grains layer can be significant to solve the above-mentioned technology difficulties.

The white-light LED can be classified according to the material filled inside as organic and inorganic ones. A commercially mature product is an inorganic white-light LED developed by Nichia Chemical, Inc. A schematic view of its structure is shown in FIG. 1. Surrounding the blue LED chip 10 is filled with yellow-light phosphor grains 20. The wavelength of the blue light emitted by the blue LED chip 10 is between 430 nm and 480 nm. Using the light emitted by the blue LED chip 10 to excite the yellow-light phosphor grains 20 will produce some blue light at the same time the yellow light is produced. The combination of the blue and yellow light provides a white light with two wavelengths.

However, since the blue light occupies a great portion of output luminance produced by the white-light LED consisted of the blue LED chip 10 and yellow-light phosphor grains 20, the color temperature tends to be higher. Moreover, the color temperature of this type of white light devices is hard to control. Therefore, one has to increase the chances for the blue light to interact with the yellow-light phosphor grains 20, in order to reduce the luminous intensity of the blue light and/or enhancing that of the yellow light.

To solve the above-mentioned problems, the U.S. Pat. No. 5,962,971 discloses an LED that uses an UV filter layer 30 coated on the top of the phosphor grain layer 40. This means makes the phosphor grains layer 40 emits light with a greater homogeneity. It also filters out the UV light emitted by the LED chip 50 to avoid damages to human eyes. As a consequence, the UV light is unnecessarily wasted, lowering the conversion efficiency of the phosphor grain layer 40.

The U.S. Pat. No. 5,813,753 discloses a UV/blue LED-phosphor device, where a short wave pass filter is coated on the light-emitting surface of the UV/blue LED stack. The functions of the short wave pass filter are: (1) to reflect light of the too long wavelength and (2) to reflect part of the light of the wanted wavelengths. The overall result is a more narrow angular distribution in the forward direction, and furthermore a more saturated color. On the other hand, on the outgoing surface of the UV/blue LED and phosphor grains layer structure, a long wave pass filter is coated to enhance the transmission of the visible light, and to reflect UV/blue light back to the phosphor grains layer. However, the conversion efficiency and LED light traveling path is not properly controlled because of the unpolarized and isotropic angular emission of the light from the UV/blue LED chip. In other words, dielectric omni-directional reflectors for the light from the UV/blue LED chip is need for enhancing the conversion efficiency.

SUMMARY OF THE INVENTION

In view of the foregoing, an objective of the invention is to provide a white-light LED with dielectric omni-directional reflectors. Dielectric omni-directional reflectors are functionally used to replace the long-wave pass filter (LWP) and/or UV/visible mirror as stated in U.S. Pat. No. 5,813,753 and coated on both side of the phosphor grains layer. Both sides of the phosphor grains layer form a Fabry-Perot like resonance cavity to enhance the light emission efficiency of the white-light LED. These dielectric omni-directional reflectors only reflect light of a specific wavelength range irrespective polarization and incident angle, such as a blue light with a wavelength of 450–500 nm or an UV light with a wavelength of 380~400 nm.

The invention related to a white-light LED with omni-directional reflectors includes an LED chip for an excitation light source. A light transmitting material surrounding the LED and phosphor grains is dispersed in order to excite fluorescence via emission of LED. The visible-light spectrum of the phosphor grains has to be compatible with the emission wavelength of the LED. And at least one or two omni-directional reflectors are symmetrically placed on the top and/or bottom of the structure including the LED chip and the light transmitting material surrounding the LED chip. When the LED chip emits UV or blue light that passes through the light transmitting material, the phosphor grains inside the light transmitting material are excited to produce secondary visible light—the fluorescence.

Since the dielectric omni-directional reflectors surrounding the light transmitting material will reflect UV or blue light repeatedly, the light from the LED is reflected omni-directionally via the dielectric omni-directional reflectors. This forms an omni-directional Fabry-Perot like light resonance cavity, i.e. the excitation light is confined in the phosphor grains layer. By reflecting the UV or blue light multiple times between the dielectric omni-directional reflectors, the phosphor grains can be excited repeatedly to increase the white-light conversion efficiency and/or to change the spectral characteristics of the visible light emission. Thus, the disclosed white-light LED can emit more white light, and/or the correlated color temperature can be changed.

As the dielectric omni-directional reflectors were designed not to totally reflect the blue light emission produced by the light emission diodes, and the blue light can be partially transmitted through the dielectric omni-directional reflectors and can be observed. Moreover the transmittance of the dielectric omni-directional reflectors for the blue light is designed so that the correlated color temperature of the white light LED can be controlled.

BRIEF DESCRIPTION OF THE DRAWINGS

The invention will become more fully understood from the detailed description given hereinbelow illustration only, and thus are not limitative of the present invention, and wherein.

DETAILED DESCRIPTION OF THE INVENTION

Figure 2:
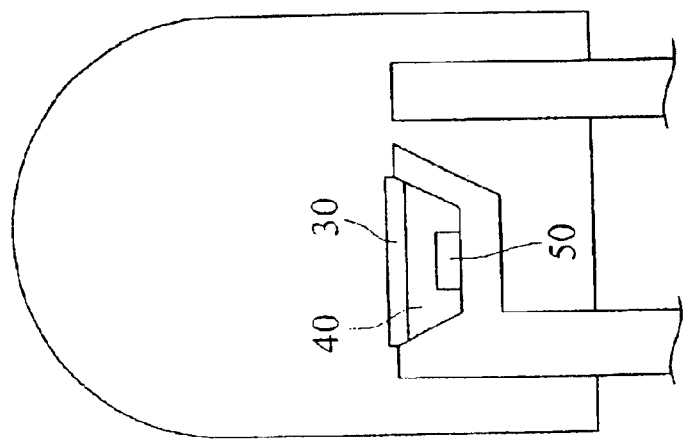
FIG. 2 is a schematic view of using an UV filter as the packaging of the light-emitting surface of the LED phosphor grain layer in the prior art.
Figure 1:
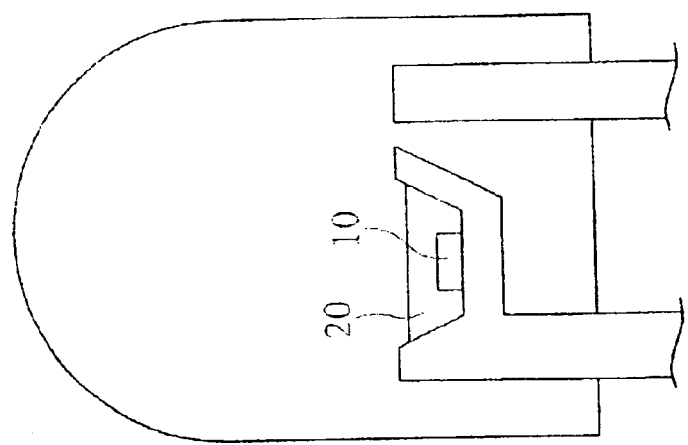
FIG. 1 is a schematic view of the structure of an inorganic white-light LED in the prior art.
Figure 3A:
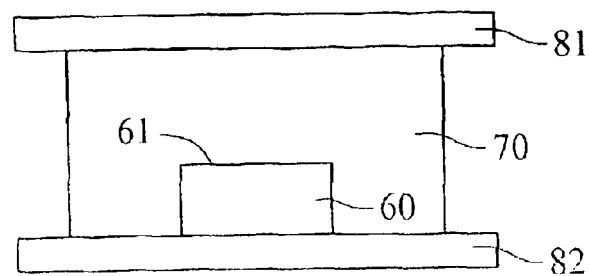
FIG. 3A shows a first embodiment of the invention.

A first embodiment of the disclosed white-light LED using dielectric omni-directional reflectors is shown in FIG. 3A. The white-light LED contains an LED chip 60. The LED chip 60 is driven by an external current to emit light. The light goes out through the outgoing surface 61 of the LED chip 60 to excite the light transmitting material 70.

The installation of the LED chip 60 is achieved by etching on a transparent electrode material layer such as ITO on the top of the rear dielectric omni-directional reflector 82 to form a circuit and then flip-chip mounted the LED chip 60 thereon. The LED chip 60 may be a blue LED chip or an UV LED chip.

Surrounding the LED chip 60 is coated with a light transmitting material 70 that is a mixture of phosphor grains and resin to produce fluorescence. The invention uses two kinds of light transmitting material 70: if using blue LED chip 60, the light transmitting material 70 can be a mixture of YAG:Ce phosphor grains and silicon resin in the ratio of 1:20 to generate yellow light; and if using UV LED chip 60, the light transmitting material 70 can be a mixture of $BaAl_{10}O_{17}:Eu^{2+}$, $BaAl_{10}O_{17}:Eu^{2+},Mn^{2+}$, and $Y_2O_3:Eu,Bi$ phosphor grains and silicon resin in the ratio of 1:20 to generate RGB light.

The visible-light spectrum emitted by the phosphor grains in the white-light LED has to be designed according to the wavelengths desired to obtain from the LED chip 60. When different LED chips 60 are used, the phosphor grains with the corresponding wavelengths have to be used in order to produce white light.

The two dielectric omni-directional reflectors 80 are symmetrically installed on both sides of the LED chip and the light transmitting material 70 and parallel to the outgoing surface 61 of the LED chip 60. In particular, the dielectric omni-directional reflector facing the outgoing surface 61 is the front dielectric omni-directional reflector 81 while the other is called the rear dielectric omni-directional reflector 82.

Coating a $SiO_2/Al_2O_3$ or $TiO2_2/SiO_2$, $Ta_2O_3/SiO_2$ multi-layer stack on the surface of glass substrates makes the front dielectric omni-directional reflector 81 and the rear dielectric omni-directional reflector 82. If using blue LED chip 60, the transmittance for blue light of the front dielectric omni-directional reflector are between 5% and 25%, i.e. reflectance is between 95~75% by controlling the multilayer thickness ratios of materials and number of layers in the coating film. If using UV LED chip 60, the reflectance for UV light of the front dielectric omni-directional reflector are 99% by controlling the thickness ratios of materials and number of layers in the coating film. Otherwise, the choice of materials and multi-layer dielectric stack structure with alternately high and low refractive index can also be implemented The manufacturing method of the front dielectric omni-directional reflector 81 and the rear dielectric omni-directional reflector 82 can be nanotechnology, such as self-assembly formation and sol-gel deposition process, or the conventional optical thin film coating, such as sputtering, E-gun, and chemical vapor deposition (CVD). The dielectric omni-directional reflectors 81, 82 can be designed to have high reflectance for specific large incident angles range and irrespective of light electric field polarizations.

When the blue/UV light emitted by the blue/UV LED chip 60 penetrates through the light transmitting material 70, the phosphor grains in the light transmitting material 70 are excited to produce secondary visible light, the fluorescence.

Since the front dielectric omni-directional reflector 81 and the rear dielectric omni-directional reflector 82 surrounding the light transmitting material 70 reflect light of a specific wavelength, the light emitted from the LED chip 60 were reflected omni-directionally, via the front dielectric omni-directional reflector 81 and the rear dielectric omni-directional reflector 82. The LED light thus undergoes repeatedly and omni-directionally reflections between the front dielectric omni-directional reflector 81 and the rear dielectric omni-directional reflector 82 to excite the phosphor grains as much as possible. Therefore, it can increase the efficiency and/or spectral characteristics and uniformity of the visible light emission.

The light outgoing surface of the front dielectric omni-directional reflector 81 is on the viewing side surface of the glass substrate of which omni-directional reflector is coated at the interface where phosphors layer and glass plate contact. Therefore, one can fabricate micro-optical devices, such as a diffractive optical elements (DOE), total internal reflection (TIR) lens and non-imaging Fresnel lens, a dome lens, a microlens array, a diffusers, or an anti-reflection (AR) coating, on the viewing side surface, in order to increase the directivity, intensity and/or uniformity of the fluorescent light emitted from the phosphors layer.

Figure 3B:
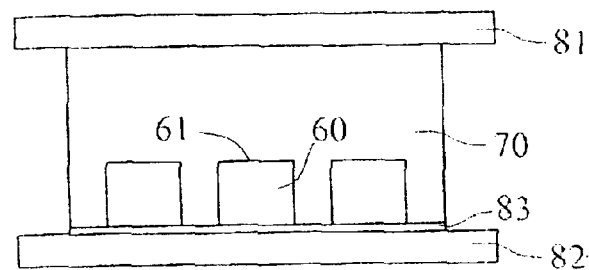
FIG. 3B shows a first embodiment of the invention with a plurality of LED chips.

Users can increase the number of the LED chip 60 depending on their need as shown in FIG. 3B, and the top of the rear dielectric omni-directional reflector 82 is covered with a transparent electrode layer—ITO 83 to form a circuit and then flip-chip mounting the LED chip 60 thereon.

Figure 4:
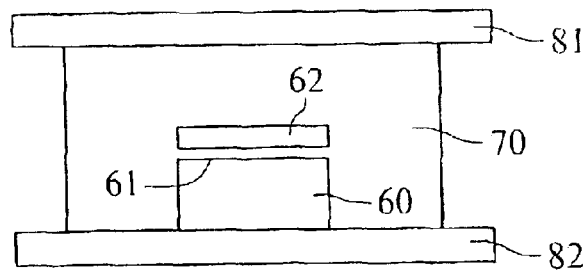
FIG. 4 shows a second embodiment of the invention.

A second embodiment of the invention is shown in FIG. 4. Its structure is roughly the same as the first embodiment. An additional short wave pass filter or band pass filter 62 is installed on the light-emitting surface 61 of the LED chip 60 to increase the emission flux of the LED 60 in the forward direction, i.e. viewing side. The filter 62 also enhanced the visible light excited from the phosphor grains to transmit toward viewing side.

A third embodiment of the invention is roughly the same as the first and second embodiments. The front dielectric omni-directional reflector 81 is still a dielectric omni-directional reflector, whereas a metal thin-film coating or a UV/visible mirror, which also achieves the same light-emitting effect, replaces the rear dielectric omni-directional reflector 82.

Figure 5:
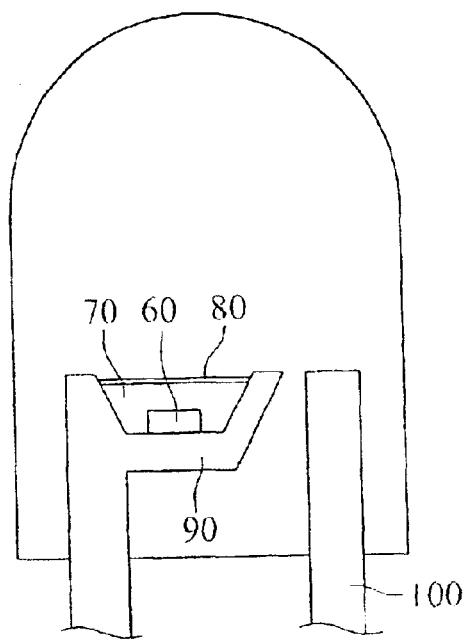
FIG. 5 shows a third embodiment of the invention.

Please refer to FIG. 5 for a fourth embodiment of the disclosed white-light LED. First, the UV or blue LED chip 60 is mounted on a supporting body with a depression—a bowl 90 of a frame. The two pins 100 of the lead frame are independent electrodes that are supplied with an electrical current. The surrounding of the LED chip 60 is coated with a light transmitting material 70, and phosphor grains are dispersed in the transmitting material 70 to excite fluorescence via emission of LED. The surface of the light transmitting material 70 is coated with a layer of $SiO_2/Al_2O_3$ or $TiO_2/SiO_2$, $Ta_2O_3/SiO_2$ as the dielectric omni-directional reflector 80.

The electrical current imposed on the metal electrodes of the frame drives the LED chip 60 to emit light. As the emitted light penetrates through the light transmitting material 70, the phosphor grains are excited to produce fluorescence. The dielectric omni-directional reflector 80 restricts the light within the light transmitting material 70 so that it is reflected repeatedly omni-directionally to increase the efficiency and/or spectral characteristics and uniformity of the visible light emission. By controlling the blue light reflectance of the dielectric omni-directional reflector 80, the color temperature of the light emitted from the white-light LED can be adjusted.

Figure 6:
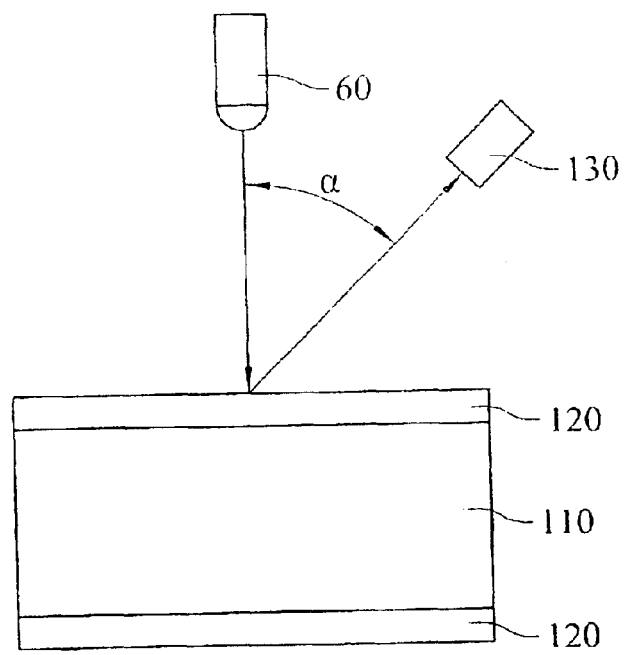
FIG. 6 is a schematic view of experimenting with the disclosed white-light LED using dielectric omni-directional reflectors.

We use the structure disclosed in the first embodiment to do two contrasting experiments. However, the blue light LED chip 60 with wavelength 450 nm is positioned above a YAG phosphors layer 110 which was sandwiched between two glass plates 120 as shown in FIG. 6, and a photodetector 130 also placed at angle α—45° to the normal of the glass surface.

Figure 7:
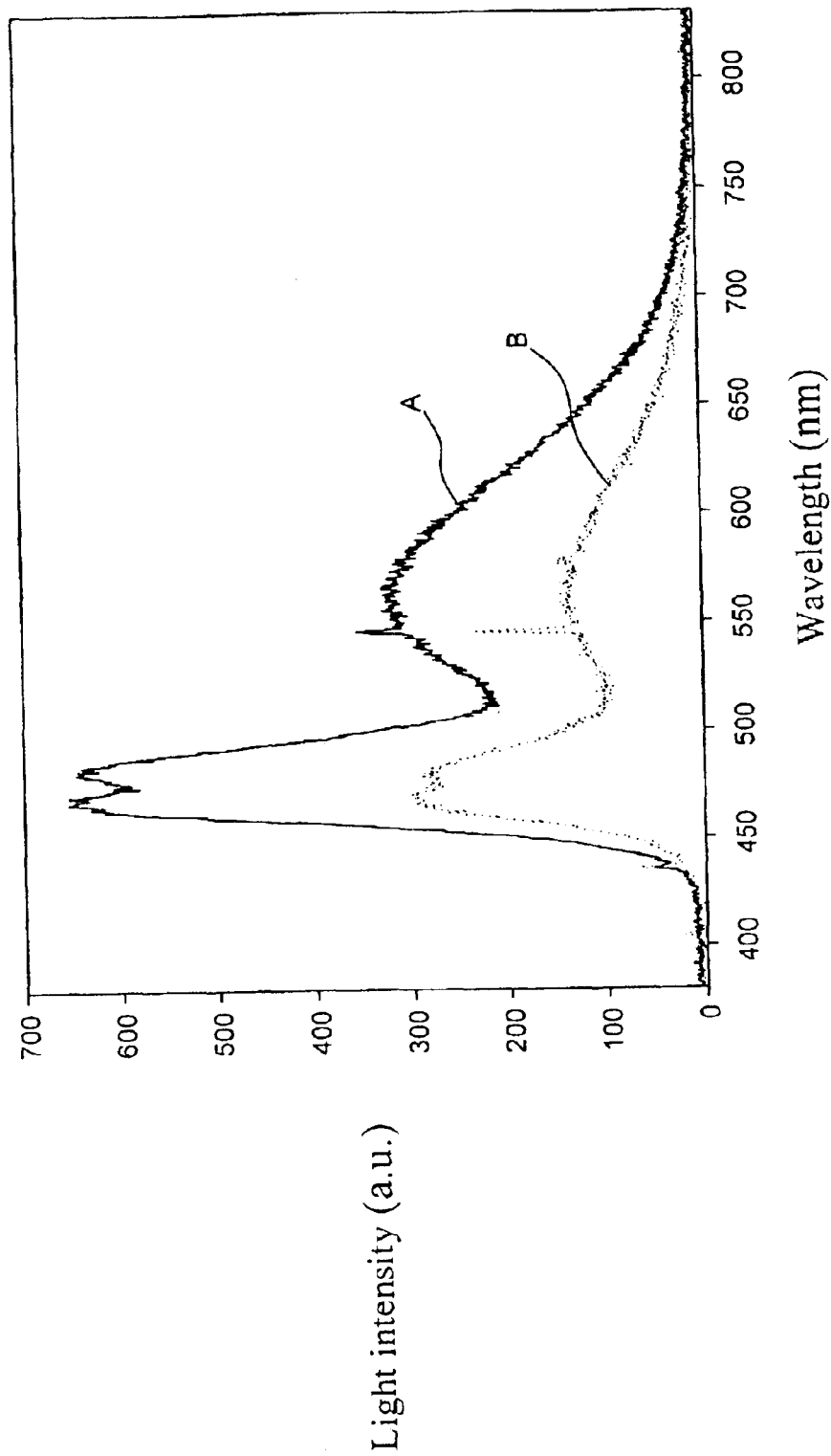
FIG. 7 shows the light intensity curves obtained from white-light LED using and without using dielectric omni-directional reflectors.

The fluorescence excited by LED chip 60 was recorded as shown in FIG. 7 with intensity vs wavelength. Curve A shows the intensity of light obtained from the white-light LED using glass plates 120 with the dielectric omni-directional reflector 80, whereas curve B shows that obtained from a usual LED of glass plates 120 without using an dielectric omni-directional reflector. A significant increasing in fluorescence intensity was observed almost doubled when the two glass plates 120 was replaced with the glass plates 120 with omni-directional reflector 80. Therefore, we conclude that the disclosed white-light LED using dielectric omni-directional reflectors is much better than those in the prior art.

Certain variations would be apparent to those skilled in the art, which variations are considered within the spirit and scope of the claimed invention.

What is claimed is:

1. A white-light light-emitting diode (LED) with dielectric omni-directional reflectors, comprising:

an LED chip for emitting white-light through an outgoing surface;

a light transmitting material surrounding the LED chip and a plurality of phosphor grains being dispersed to excite fluorescence via emission of the LED chip; and two omni-directional reflectors placed on the top and bottom of the LED chip which is surrounded by the light transmitting material, the one facing the outgoing surface being a front dielectric omni-directional reflector and the other being a rear omni-directional reflector;

wherein light emitted from the LED chip reflected omni-directionally, via the omni-directional reflectors.

2. The white-light LED of claim 1, wherein the LED chip is selected from the group consisting of UV LED chip and blue LED chip.

3. The white-light LED of claim 1, wherein a light outgoing surface of the LED chip is installed with a short wave pass filter to increase the outgoing flux of the LED chip.

4. The white-light LED of claim 1, wherein the visible-light spectrum of the phosphor grains has to be compatible with the wavelength of the LED chip.

5. The white-light LED of claim 1, wherein the front dielectric omni-directional reflector is formed by coating a multi-layer dielectric stack structure with alternately high and low refractive index.

6. The white-light LED of claim 5, wherein the material of the multi-layer dielectric stack is selected from one or more member(s) of the group consisting of $SiO_2/Al_2O_3$, $TiO_2/SiO_2$, and $Ta_2O_3/SiO_2$.

7. The white-light LED of claim 1, wherein the light viewing side surface of glass plate where the front dielectric omni-directional reflector coated is selected from the group consisting of a diffractive optical element (DOE) total internal reflection (TIR) lens, dome lens, non-imaging Fresnel lens, microlens, microlens array, a diffuser, and an anti-reflection (AR) coating.

8. The white-light LED of claim 1, wherein the front dielectric omni-directional reflector is a dielectric stack of optical thin-film coating layers.

9. The white-light LED of claim 1, wherein the manufacturing method of the front dielectric omni-directional reflector is selected from the group consisting of self-assembly, sol-gel deposition process by spin coating, dipping, sputtering, E-gun deposition, and chemical vapor deposition (CVD).

10. The white-light LED of claim 1, wherein the rear omni-directional reflector is selected from the group consisting of a metal thin-film coating and a visible/UV mirror.

11. The white-light LED of claim 1, wherein the rear omni-directional reflector is formed by coating a multi-layer dielectric stack structure with alternately high and low refractive index.

12. The white-light LED of claim 11, wherein the material of the multi-layer dielectric stack is selected from one or more member(s) of the group consisting of $SiO_2/Al_2O_3$, $TiO_2/SiO_2$, and $Ta_2O_3/SiO_2$.

13. The white-light LED of claim 1, wherein the manufacturing method of the rear-dielectric omni-directional reflector is selected from the group consisting of self-assembly, sol-gel deposition process by spin coating, dipping sputtering, E-gun, and chemical vapor deposition (CVD).

14. A white-light light-emitting diode (LED) with dielectric omni-directional reflectors, comprising:

a plurality of LED chips for emitting white-light through an outgoing surface;

a light transmitting material surrounding the LED chip and a plurality of phosphor grains being dispersed to excite fluorescence via emission of the LED chip; and two omni-directional reflectors on the top and bottom of the LED chip, which is surrounded by the light transmitting material, the one facing the outgoing surface being a front dielectric omni-directional reflector and the other being a rear omni-directional reflector, and the top of the rear omni-directional reflector being covered with a transparent electrode layer to form a circuit;

wherein light emitted from the LED chip is reflected omni-directionally, via the omni-directional reflectors.

15. The white-light LED of claim 14, wherein the LED chip is selected from the group consisting of UV LED chip and blue LED chip.

16. The white-light LED of claim 14, wherein a light outgoing surface of the LED chip is installed with a short wave pass filter to increase the outgoing flux of the LED chip.

17. The white-light LED of claim 14, wherein the visible-light spectrum of the phosphor grains has to be compatible with the desired wavelength of the LED chip.

18. The white-light LED of claim 14, wherein the front dielectric omni-directional reflector is formed by coating a multi-layer dielectric stack structure with alternately high and low refractive index.

19. The white-light LED of claim 18, wherein the material of the multi-layer dielectric stack is selected from one or more member(s) of the group consisting of $SiO_2/Al_2O_3$, $TiO_2/SiO_2$, and $Ta_2O_3/SiO_2$.

20. The white-light LED of claim 14, wherein the light viewing side surface of glass plate where the front dielectric omni-directional reflector coated is selected from the group consisting of a diffractive optical element (DOE) total internal reflection (TIR) lens, dome lens, non-imaging Fresnel lens, microlens, microlens array, a diffuser, and an anti-reflection (AR) coating.

21. The white-light LED of claim 14, wherein the front dielectric omni-directional reflector is a dielectric stack of optical thin-film coating layers.

22. The white-light LED of claim 14, wherein the manufacturing method of the front dielectric omni-directional reflector is selected from the group consisting of self-assembly, sol-gel deposition process by spin coating, dipping, sputtering, E-gun deposition, and chemical vapor deposition (CVD).

23. The white-light LED of claim 14, wherein the rear omni-directional reflector is selected from the group consisting of a metal thin-film coating and a visible/UV mirror.

24. The white-light LED of claim 14, wherein the rear omni-directional reflector is formed by coating a multi-layer dielectric stack structure with alternately high and low refractive index.

25. The white-light LED of claim 24, wherein the material of the multi-layer dielectric stack is selected from one or more member(s) of the group consisting of $SiO_2/Al_2O_3$, $TiO_2/SiO_2$, and $Ta_2O_3/SiO_2$.

26. The white-light LED of claim 14, wherein the manufacturing method of the rear omni-directional reflector is selected from the group consisting of self-assembly, sol-gel deposition process by spin coating, dipping sputtering, E-gun, and chemical vapor deposition (CVD).

27. The white-light LED of claim 14, wherein the transparent electrode layer is ITO.

28. A white-light LED with dielectric omni-directional reflectors comprising: an LED chip installed in a supporting body having an upper surface with a depression having an opening in the upper surface for emitting white-light, a light transmitting material surrounding the LED and a plurality of phosphor grains being dispersed to excite fluorescence via light emission of the LED chip through the light transmitting material, wherein the white-light LED is characterized in that: the surface of the light transmitting material having an dielectric omni-directional reflector to reflect the light from the LED chip omni-directionally irrespective of polarization.

29. The white-light LED of claim 28, wherein the LED chip is selected from the group consisting of an UV LED chip and a blue LED chip.

30. The white-light LED of claim 28, wherein the visible-light spectrum of the phosphor grains has to be compatible with the desired wavelength of the LED chip.

31. The white-light LED of claim 28, wherein the dielectric omni-directional reflector is a dielectric optical thin-film coating.

32. The white-light LED of claim 28, wherein the dielectric omni-directional reflector is formed by coating a multi-layer dielectric stack structure with alternately high and low refractive index.

33. The white-light LED of claim 32, wherein the material of the multi-layer dielectric stack is selected one or more member(s) of the group consisting of $SiO_2/Al_2O_3$, $TiO_2/SiO_2$, and $Ta_2O_3/SiO_2$.

* * * * *

UNITED STATES PATENT AND TRADEMARK OFFICE
CERTIFICATE OF CORRECTION

PATENT NO.    : 6,833,565 B2
DATED         : December 21, 2004
INVENTOR(S)   : Jung-Chieh Su et al.

It is certified that error appears in the above-identified patent and that said Letters Patent is hereby corrected as shown below:

Column 4,
Line 24, please change the formula from "$Ta_2O_3/SiO_2$" to -- $Ta_2O_5/SiO_2$ --;

Column 5,
Line 41, please change the formula from "$Ta_2O_3/SiO_2$" to -- $Ta_2O_5/SiO_2$ --;

Column 6,
Line 44, please change the formula from "$Ta_2O_3/SiO_2$" to -- $Ta_2O_5/SiO_2$ --;

Column 7,
Lines 4 and 45, please change the formula from "$Ta_2O_3/SiO_2$" to -- $Ta_2O_5/SiO_2$ --; and Column 8,
Lines 17 and 53, please change the formula from "$Ta_2O_3/SiO_2$" to -- $Ta_2O_5/SiO_2$ --.

Signed and Sealed this

Nineteenth Day of April, 2005

JON W. DUDAS
*Director of the United States Patent and Trademark Office*